(12) United States Patent
Yi

(10) Patent No.: US 10,859,881 B2
(45) Date of Patent: Dec. 8, 2020

(54) ARRAY SUBSTRATE AND FABRICATING METHOD THEREOF

(71) Applicant: SHENZHEN CHINA STAR OPTOELECTRONICS TECHNOLOGY CO., LTD., Guangdong (CN)

(72) Inventor: Zhiguang Yi, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/485,654

(22) PCT Filed: Mar. 10, 2017

(86) PCT No.: PCT/CN2017/076308
§ 371 (c)(1),
(2) Date: Aug. 13, 2019

(87) PCT Pub. No.: WO2018/148997
PCT Pub. Date: Aug. 23, 2018

(65) Prior Publication Data
US 2019/0361279 A1 Nov. 28, 2019

(30) Foreign Application Priority Data

Feb. 14, 2017 (CN) .......................... 2017 1 0078596

(51) Int. Cl.
*G02F 1/1362* (2006.01)
*H01L 27/12* (2006.01)
*G02F 1/1333* (2006.01)
*G02F 1/1368* (2006.01)

(52) U.S. Cl.
CPC ...... *G02F 1/1362* (2013.01); *G02F 1/133345* (2013.01); *G02F 1/136227* (2013.01); *H01L 27/1248* (2013.01); *H01L 27/1262* (2013.01); *G02F 1/1368* (2013.01); *G02F 2001/136222* (2013.01)

(58) Field of Classification Search
CPC ............................... G02F 1/1362; H01L 27/12
USPC ............................................... 257/72; 349/46
See application file for complete search history.

(56) References Cited

U.S. PATENT DOCUMENTS

2004/0246424 A1* 12/2004 Sawasaki .......... G02F 1/136227
349/138
2019/0072696 A1* 3/2019 Li ....................... H01L 27/1288

* cited by examiner

*Primary Examiner* — David Vu
*Assistant Examiner* — Brandon C Fox
(74) *Attorney, Agent, or Firm* — Mark M. Friedman

(57) ABSTRACT

The present invention provides an array substrate and a method of fabricating the same, wherein the array substrate includes a base substrate, a gate layer, a gate insulating layer, a source/drain layer, a first passivation layer, a color resist layer and a second passivation layer, wherein a passivation layer via hole is provided above the source/drain layer, and gas in the color resist layer releases from a surface of the color resist layer on a side of the passivation layer via hole. The invention realizes the purpose of completely discharging the gas in the color resist layer before a cell formation process.

17 Claims, 4 Drawing Sheets

ARRAY SUBSTRATE AND FABRICATING METHOD THEREOF

BACKGROUND OF INVENTION

Field of Invention

The present invention relates to a field of liquid crystal display, and in particular to an array substrate and a method of fabricating the same.

Description of Prior Art

The existing color filter on array (COA) products are prone to bubble generation upon impact due to two main reasons. One is that via holes of a color filter substrate (CF) at a local position overlap with via holes of a thin film transistor (TFT), and a passivation layer (PV) at the overlapping position is removed by dry etch, causing the gas in the color resist layer to release from the overlapping position to form air bubbles after cell formation. An improvement countermeasure is to enlarge a size of the via hole of the color resist layer so as not to overlap with the via hole of the passivation layer, which reduces the transmittance, however. Another one is that the PV will crack during vibration, causing the gas in the color resist layer to release to form air bubbles. At present, a countermeasure is to open a small hole in the color resist layer, so that the gas can be released in advance. However, an etching rate of the color resist layer is lower than that of the PV, and it is likely that the gas cannot be released in advance due to insufficient etching depth.

In an originally developed COA product, a passivation layer via hole is opened in a via hole of a CF color resist layer, and the COA process is to form the color resist layer on the array substrate. The color resist layer having a greater overall thickness, generally 2.5 um to 3 um. On the other hand, the total thickness of the gate layer, the gate insulating layer, and the source/drain layer in the PV drying is only about 0.7 um. If the color resist layer is not opened, the overall etching time will be too long, and since the color resist layer is physically etched, the etched via hole is substantially vertical, which is not conducive to the covering of the ITO electrode layer, and there is a risk of breakage. Therefore, at present, the color resist layer is opened first, and then the via hole of the passivation layer is formed through the color resist layer. If the via hole of the color resist layer overlaps with the via hole of the passivation layer, a channel through which the gas flows out of the color resist layer will be formed at the overlapping portion. Since the overlap is located locally, the gas should release continuously. Therefore, the gas still releases to form into air bubbles after cell formation. In order to improve this problem, one method is to make the via hole of the color resist layer relatively large, so that the problem that the via hole of the color resist layer overlaps with the via hole of the passivation layer does not occur. This improvement countermeasure, however, reduces an aperture ratio. Another method is to open a hole in the color resist layer to allow the gas to release in advance. However, due to the large difference between the etching rates of the color resist layer and the PV, the etching depth is insufficient, resulting in the inability to reach the gas release position.

SUMMARY OF INVENTION

An object of the present invention to provide an array substrate and a display device for achieving the purpose of completely exhausting gas in a color resist layer before a cell formation process.

Technical solutions of the present invention are as follows:

An array substrate is provided, including: a base substrate; a gate layer disposed on the base substrate; a gate insulating layer disposed on the base substrate and covering the gate layer; a source/drain layer disposed on the gate insulating layer; a first passivation layer covering a portion of the source/drain layer and the gate insulating layer; a color resist layer disposed on the first passivation layer; and a second passivation layer disposed on the color resist layer, wherein a passivation layer via hole is provided above the source/drain layer, the passivation layer via hole penetrates the second passivation layer, the color resist layer, and the first passivation layer, and extends to a surface of the source/drain layer, and a side of the passivation layer via hole exposes the color resist layer to allow gas in the color resist layer to escape.

Preferably, a first side of the passivation layer via hole is in communication with the second passivation layer and the first passivation layer, and a second side of the passivation layer via hole is in communication with the second passivation layer, the color resist layer, and the first passivation layer, the gas in the color resist layer escapes from the color resist layer on the second side.

Preferably, the array substrate further includes an indium tin oxide (ITO) electrode layer, the ITO electrode layer covering a portion of the second passivation layer, the first side, and a portion of a bottom of the passivation layer via hole.

Preferably, a surface of the source/drain layer corresponding to a bottom of the passivation layer via hole is a concave surface, and a bottom of the concave surface is the bottom of the passivation layer via hole.

Preferably, a bottom portion of the color resist layer is provided with a plurality of vents, and the plurality of vents communicate with each other and in communication with a surface of the color resist layer on the second side.

Preferably, a contact surface of the color resist layer and the second passivation layer is provided with a gas passage, the gas passage is in communication with a surface of the color resist layer on the second side.

Preferably, surfaces of the second passivation layer and the first passivation layer on the first side are both inclined surfaces.

Preferably, cross section of an upper portion of the second side is in a right-angle shape, and a horizontal side of the right-angle shape is formed in the color resist layer by wet etching.

A method of fabricating the array substrate is also provided, including the following steps: forming the gate layer, the gate insulating layer, the source/drain layer, the first passivation layer, and the color resist layer sequentially from bottom to top on the base substrate; forming a color resist via hole on the color resist layer, the color resist via hole penetrating the color resist layer and the first passivation layer and extending to the source/drain layer; forming the second passivation layer on the color resist layer and the color resist via hole, the second passivation layer covering the color resist layer and the color resist via hole; forming a photoresist layer on the second passivation layer, and removing the photoresist layer corresponding to a bottom surface and a side of the color resist via hole by exposure and development to expose the corresponding second passivation layer; and etching an exposed portion of the second passivation layer, to expose the source/drain layer and the color resist layer corresponding to the exposed portion to form the passivation layer via hole.

Preferably, after forming the passivation layer via hole, the method further includes: forming an indium tin oxide (ITO) electrode layer on a bottom surface of the passivation layer via hole and a side of the passivation layer via hole covered with the second passivation layer.

An array substrate is also provided, including: a base substrate; a gate layer disposed on the base substrate; a gate insulating layer disposed on the base substrate and covering the gate layer; a source/drain layer disposed on the gate insulating layer; a first passivation layer covering a portion of the source/drain layer and the gate insulating layer; a color resist layer disposed on the first passivation layer; and a second passivation layer disposed on the color resist layer, wherein a passivation layer via hole is provided above the source/drain layer, the passivation layer via hole penetrates the second passivation layer, the color resist layer, and the first passivation layer, and extends to a surface of the source/drain layer, and a side of the passivation layer via hole exposes the color resist layer to allow gas in the color resist layer to escape, wherein a first side of the passivation layer via hole is in communication with the second passivation layer and the first passivation layer, and a second side of the passivation layer via hole is in communication with the second passivation layer, the color resist layer, and the first passivation layer, the gas in the color resist layer escapes from the color resist layer on the second side, and wherein the array substrate further includes an indium tin oxide (ITO) electrode layer, the ITO electrode layer covering a portion of the second passivation layer, the first side, and a portion of a bottom of the passivation layer via hole.

Preferably, a surface of the source/drain layer corresponding to a bottom of the passivation layer via hole is a concave surface, and a bottom of the concave surface is the bottom of the passivation layer via hole.

Preferably, a bottom portion of the color resist layer is provided with a plurality of vents, and the plurality of vents communicate with each other and in communication with a surface of the color resist layer on the second side.

Preferably, a contact surface of the color resist layer and the second passivation layer is provided with a gas passage, the gas passage is in communication with a surface of the color resist layer on the second side.

Preferably, surfaces of the second passivation layer and the first passivation layer on the first side are both inclined surfaces.

Preferably, a cross section of an upper portion of the second side is in a right-angle shape, and a horizontal side of the right-angle shape is formed in the color resist layer by wet etching.

Preferably, the indium tin oxide (ITO) electrode layer is provided on a bottom surface of the passivation layer via hole and a side surface of the passivation layer via hole covered with the second passivation layer.

Beneficial effects of the present invention:

The present invention provides an array substrate and a method of fabricating the same, wherein a passivation layer via hole is formed corresponding to a source/drain layer, the passivation layer via hole penetrates a second passivation layer, a color resist layer, and a first passivation layer, a bottom of the passivation layer via hole is in contact with a surface of the source/drain layer, a first side of the passivation layer via hole is in communication with the second passivation layer and the first passivation layer, and a second side of the passivation layer via hole is in communication with the second passivation layer, the color resist layer, and the first passivation layer to form an effective gas passage, and the gas in the color resist layer releases from a surface of the color resist layer on the second side, thereby reducing a risk of bubble occurrence in the liquid crystal panel.

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the FIGS. which are merely references. The spatially relative terms are intended to encompass different orientations in addition to the orientation as depicted in the FIGS.

Embodiment 1

Figure 1:
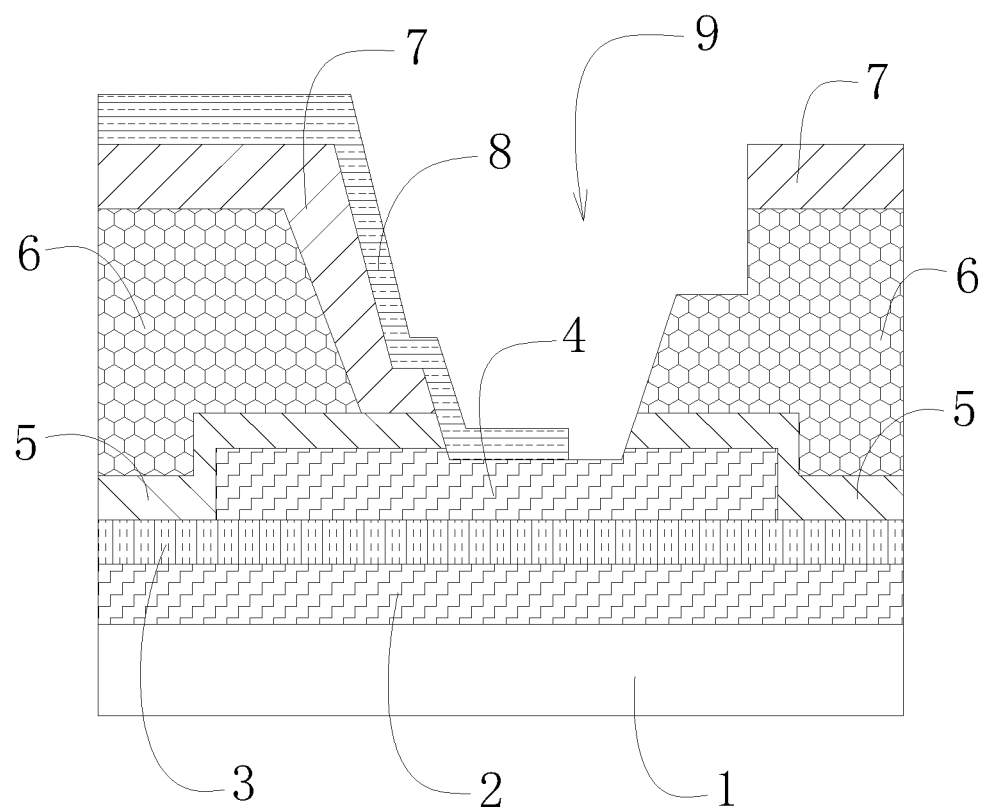
FIG. 1 is a cross-sectional view showing an overall structure of an array substrate according to an embodiment of the present invention.
Figure 2:
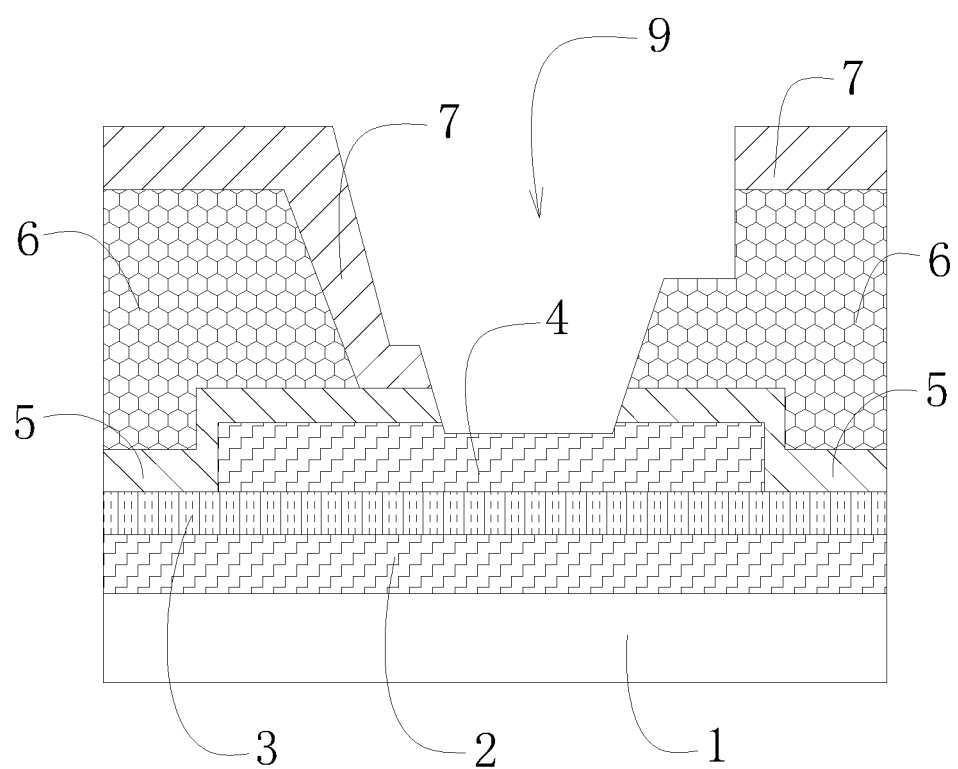
FIG. 2 is a schematic cross-sectional view showing an overall structure of an array substrate excluding an ITO electrode layer according to an embodiment of the present invention.

Please refer to FIG. 1. FIG. 1 is a cross-sectional view showing an overall structure of an array substrate according to an embodiment of the present invention. As can be seen from FIG. 1, an array substrate of the present invention includes the follows.

A base substrate 1 is preferably a glass substrate.

A gate layer 2 is provided on the base substrate 1.

A gate insulating layer 3 is provided on the base substrate 1 and covers the gate layer 2.

A source/drain layer 4 is provided on the gate insulating layer 3.

A first passivation layer 5 covers a portion of the source/drain layer and the gate insulating layer 3.

A color resist layer 6 is disposed on the first passivation layer 5 and covers a portion of the first passivation layer 5.

A second passivation layer 7 is disposed on the color resist layer 6 and covers a portion of the color resist layer 6 and the first passivation layer 5.

A passivation layer via hole 9 is provided above the source/drain layer 4, the passivation layer via hole 9 penetrates the second passivation layer 7, the color resist layer 6, and the first passivation layer 5, and extends to a surface of the source/drain layer 4, and a side of the passivation layer via hole 9 exposes the color resist layer 6 to allow gas in the color resist layer 6 to escape.

A first side of the passivation layer via hole 9 (i.e., the left side of the passivation layer via hole 9 in FIG. 1) is in communication with the second passivation layer 7 and the first passivation layer 5, and a second side of the passivation layer via hole 9 (i.e., the right side of the passivation layer via hole 9 in FIG. 1) is in communication with the second passivation layer 9, the color resist layer 6, and the first passivation layer 5, the gas in the color resist layer 6 escapes from the color resist layer 6 on the second side.

In this embodiment, the array substrate further includes an indium tin oxide (ITO) electrode layer 8, and the ITO electrode layer 8 covers a portion of the second passivation layer 7, the first side, and a portion of a bottom of the passivation layer via hole 9.

In this embodiment, a surface of the source/drain layer 5 corresponding to a bottom of the passivation layer via hole 9 is a concave surface, and a bottom of the concave surface is the bottom of the passivation layer via hole 9. The concave surface is provided to ensure that the first passivation layer 5 is completely etched away, and that the ITO electrode layer 8 can be sufficiently in contact with the source/drain layer 4.

In this embodiment, the bottom of the color resist layer 6 is provided with a plurality of vents (not shown), and the plurality of vents communicate with each other and in communication with a surface of the color resist layer 6 on the second side. In addition, a contact surface of the color resist layer 6 and the second passivation layer 7 is provided with a gas passage (not shown), and the gas passage is in communication with a surface of the color resist layer 6 on the second side. The vents and the gas passage described above are all naturally formed due to physicochemical action when coating the color resist layer 6. As such, the gas in the color resist layer 6 corresponding to the first side can release through the surface of the color resist layer 6 on the second side.

In this embodiment, surfaces of the second passivation layer 7 and the first passivation layer 5 on the first side are both inclined surfaces. Thus, the ITO electrode layer 8 covering the first side is less prone to breakage.

In this embodiment, a cross section of an upper portion of the second side is in a right-angle shape, and a horizontal side of the right-angle shape is formed in the color resist layer 6 by wet etching In this embodiment, since the first side bridges the drain and the pixel electrode through the ITO electrode layer 8, the color resist layer 6 and the passivation layer via hole 9 of this portion are designed not to be in communication with each other. The second side is where the gas in the color resist layer 6 releases from, and the color resist layer 6 is required to communicate with the passivation layer via hole 9. On the second side, because the color resist layer 6 and the passivation layer via hole 9 are designed to be in communication with each other, there are many release paths, and the gas in the color resist layer 6 is completely discharged before the cell formation process. In addition, the slopes of the first passivation layer 5 and the second passivation layer 7 formed on the first side are relatively flat, the ITO electrode layer 8 deposited thereon does not break, and a slope region of the second side of the color resist layer 6 is exposed, not covered by the second passivation layer 7, so that the gas in the color resist layer 6 can quickly release, thereby improving the bubble problem.

An array substrate of the present invention is provided to reduce the risk of bubble generation in the liquid crystal panel, by providing a passivation layer via hole 9 above the source/drain layer 4, wherein the passivation layer via hole 9 penetrates the second passivation layer 7, the color resist layer 6, and the first passivation layer 5, the bottom of the passivation layer via hole 9 is in contact with the surface of the source/drain layer 4, and the first side of the passivation layer via hole 9 is in communication with the second passivation layer 7 and the first passivation layer 5, the second side of the passivation layer via hole 9 communicates with the second passivation layer 7, the color resist layer 6, and the first passivation layer 5 to form an effective gas passage, and the gas in the color resist layer 6 releases in advance from the second side of the color resist layer 6.

Embodiment 2

Figure 3:
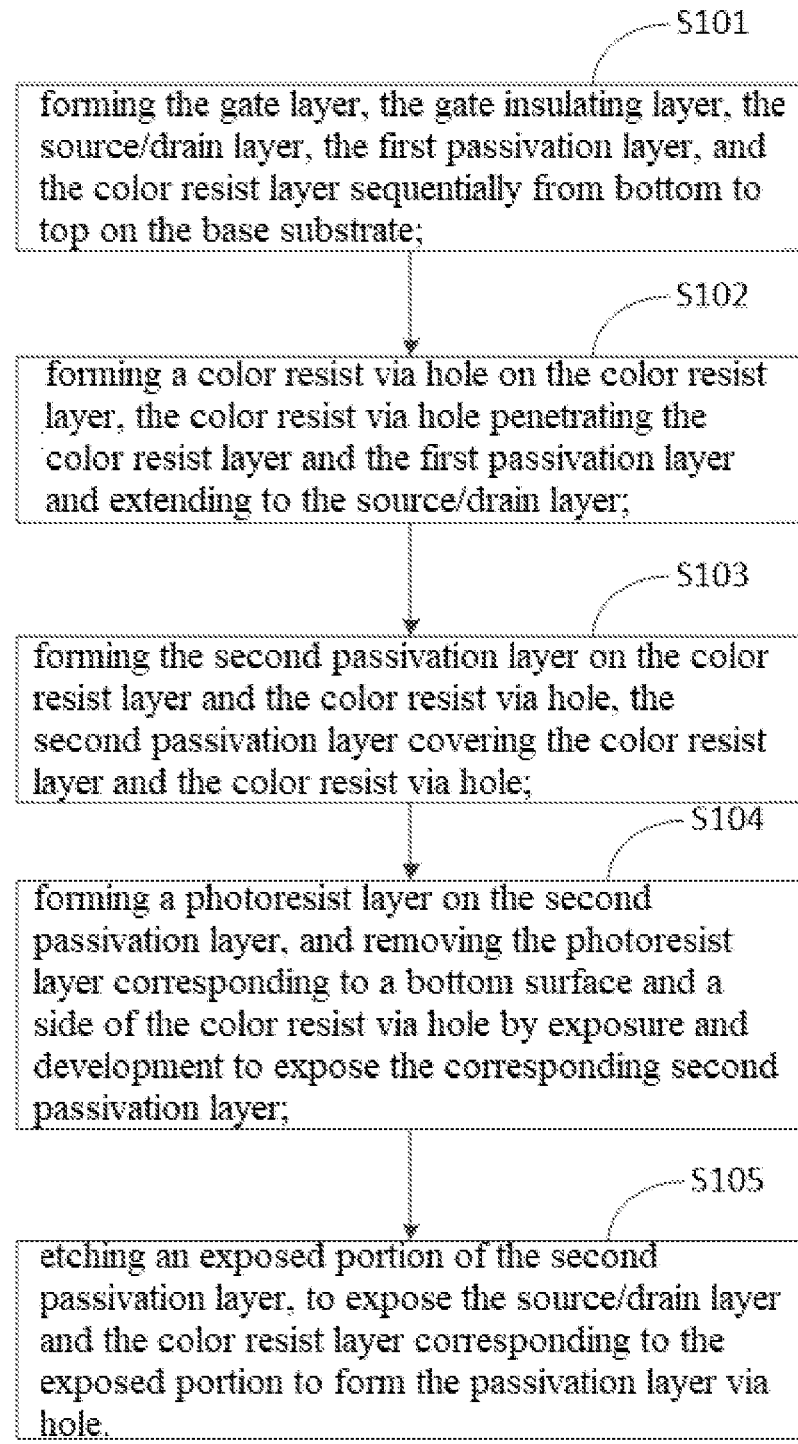
FIG. 3 is a flow chart of steps for implementing a method of fabricating an array substrate according to an embodiment of the present invention.

Please refer to FIG. 3. FIG. 3 a flow chart of steps for implementing a method of fabricating an array substrate according to an embodiment of the present invention.

The present invention provides a method of fabricating the array substrate according to the first embodiment. The fabricating method includes the following steps:

Step S101: forming the gate layer 2, the gate insulating layer 3, the source/drain layer 4, the first passivation layer 5, and the color resist layer 6 sequentially from bottom to top on the base substrate 1.

Step S102: forming a color resist via hole on the color resist layer 6, the color resist via hole communicating with the first passivation layer 5 corresponding to the upper side of the source/drain layer 4, that is, the color resist via hole penetrating the color resist layer 6 and the first passivation layer 5 and extending to the source/drain layer 4.

Step S103: forming the second passivation layer 7 on the color resist layer 6 and the color resist via hole, and the second passivation layer 7 covers the color resist layer 6 and the color resist hole.

Figure 4:
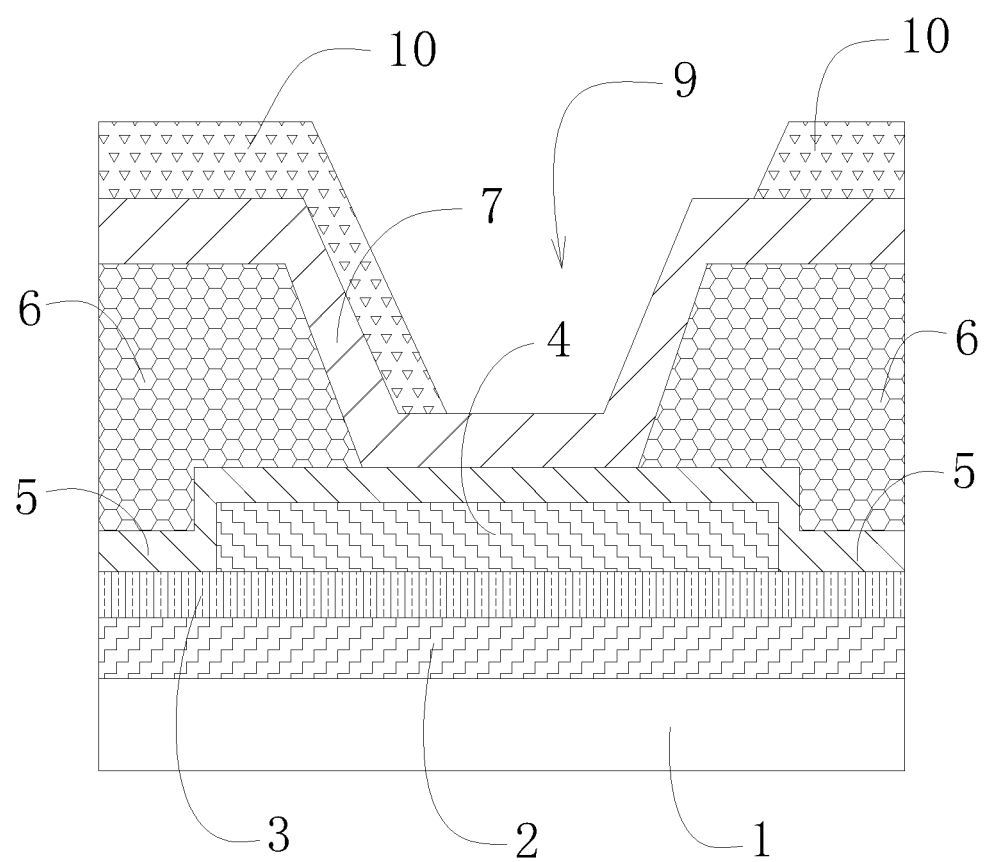
FIG. 4 is a schematic diagram of an exposed second passivation layer at a corresponding position after removing a photoresist layer on a bottom surface and a side of a second via hole in the flow chart of steps for implementing a method of fabricating an array substrate according to an embodiment of the present invention.

Step S104: forming a photoresist layer 10 on the second passivation layer 7, and removing the photoresist layer 10 corresponding to a bottom surface and a side of the color resist via hole by exposure and development to expose the corresponding second passivation layer 7, wherein an exposed portion of the second passivation layer 7 corresponds to the color resist layer 6 vertically below. This step is shown in FIG. 4.

Step S105: etching the exposed portion of the second passivation layer 7, to expose the source/drain layer 4 and the color resist layer 6 corresponding to the exposed portion to form the passivation layer via hole 9.

In this embodiment, after the passivation layer via hole 9 is formed, the method further includes: forming an indium tin oxide (ITO) electrode layer 8 on a bottom surface of the passivation layer via hole 9 and a side of the passivation layer via hole 9 covered with the second passivation layer 7.

In this embodiment, the etching is preferably performed by plasma bombardment.

A method of fabricating an array substrate according to the present invention is provided to reduce the risk of bubble generation in the liquid crystal panel, by providing a passivation layer via hole 9 above the source/drain layer 4, wherein the passivation layer via hole 9 penetrates the second passivation layer 7, the color resist layer 6, and the first passivation layer 5, the bottom of the passivation layer via hole 9 is in contact with the surface of the source/drain layer 4, and the first side of the passivation layer via hole 9 is in communication with the second passivation layer 7 and the first passivation layer 5, the second side of the passivation layer via hole 9 communicates with the second passivation layer 7, the color resist layer 6, and the first passivation layer 5 to form an effective gas passage, and the gas in the color resist layer 6 releases in advance from the second side of the color resist layer 6.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An array substrate, comprising:
   a base substrate;
   a gate layer disposed on the base substrate;
   a gate insulating layer disposed on the base substrate and covering the gate layer;
   a source/drain layer disposed on the gate insulating layer;
   a first passivation layer covering a portion of the source/drain layer and the gate insulating layer;
   a color resist layer disposed on the first passivation layer; and
   a second passivation layer disposed on the color resist layer,
   wherein a passivation layer via hole is provided above the source/drain layer, the passivation layer via hole penetrates the second passivation layer, the color resist layer, and the first passivation layer, and extends to a surface of the source/drain layer, and a side of the passivation layer via hole exposes the color resist layer to allow gas in the color resist layer to escape.

2. The array substrate according to claim 1, wherein a first side of the passivation layer via hole is in communication with the second passivation layer and the first passivation layer, and a second side of the passivation layer via hole is in communication with the second passivation layer, the color resist layer, and the first passivation layer, the gas in the color resist layer escapes from the color resist layer on the second side.

3. The array substrate according to claim 1, further comprising an indium tin oxide (ITO) electrode layer, the ITO electrode layer covering a portion of the second passivation layer, the first side, and a portion of a bottom of the passivation layer via hole.

4. The array substrate according to claim 1, wherein a surface of the source/drain layer corresponding to a bottom of the passivation layer via hole is a concave surface, and a bottom of the concave surface is the bottom of the passivation layer via hole.

5. The array substrate according to claim 1, wherein a bottom portion of the color resist layer is provided with a plurality of vents, and the plurality of vents communicate with each other and in communication with a surface of the color resist layer on the second side.

6. The array substrate according to claim 1, wherein a contact surface of the color resist layer and the second passivation layer is provided with a gas passage, and the gas passage is in communication with a surface of the color resist layer on the second side.

7. The array substrate according to claim 1, wherein surfaces of the second passivation layer and the first passivation layer on the first side are both inclined surfaces.

8. The array substrate according to claim 1, wherein a cross section of an upper portion of the second side is in a right-angle shape, and a horizontal side of the right-angle shape is formed in the color resist layer by wet etching.

9. A method of fabricating the array substrate according to claim 1, comprising the following steps:
   forming the gate layer, the gate insulating layer, the source/drain layer, the first passivation layer, and the color resist layer sequentially from bottom to top on the base substrate;
   forming a color resist via hole on the color resist layer, the color resist via hole penetrating the color resist layer and the first passivation layer and extending to the source/drain layer;
   forming the second passivation layer on the color resist layer and the color resist via hole, the second passivation layer covering the color resist layer and the color resist via hole;
   forming a photoresist layer on the second passivation layer, and removing the photoresist layer corresponding to a bottom surface and a side of the color resist via hole by exposure and development to expose the corresponding second passivation layer; and,
   etching an exposed portion of the second passivation layer, to expose the source/drain layer and the color resist layer corresponding to the exposed portion to form the passivation layer via hole.

10. The method according to claim 9, wherein after forming the passivation layer via hole, the method further comprises:
    forming an indium tin oxide (ITO) electrode layer on a bottom surface of the passivation layer via hole and a side of the passivation layer via hole covered with the second passivation layer.

11. An array substrate, comprising:
    a base substrate;
    a gate layer disposed on the base substrate;
    a gate insulating layer disposed on the base substrate and covering the gate layer;
    a source/drain layer disposed on the gate insulating layer;
    a first passivation layer covering a portion of the source/drain layer and the gate insulating layer;
    a color resist layer disposed on the first passivation layer; and
    a second passivation layer disposed on the color resist layer,
    wherein a passivation layer via hole is provided above the source/drain layer, the passivation layer via hole penetrates the second passivation layer, the color resist layer, and the first passivation layer, and extends to a surface of the source/drain layer, and a side of the passivation layer via hole exposes the color resist layer to allow gas in the color resist layer to escape;
    wherein a first side of the passivation layer via hole is in communication with the second passivation layer and the first passivation layer, and a second side of the passivation layer via hole is in communication with the second passivation layer, the color resist layer, and the first passivation layer, the gas in the color resist layer escapes from the color resist layer on the second side, and
    wherein the array substrate further comprises an indium tin oxide (ITO) electrode layer, the ITO electrode layer covering a portion of the second passivation layer, the first side, and a portion of a bottom of the passivation layer via hole.

12. The array substrate according to claim 11, wherein a surface of the source/drain layer corresponding to a bottom of the passivation layer via hole is a concave surface, and a bottom of the concave surface is the bottom of the passivation layer via hole.

13. The array substrate according to claim 11, wherein a bottom portion of the color resist layer is provided with a plurality of vents, and the plurality of vents communicate with each other and in communication with a surface of the color resist layer on the second side.

14. The array substrate according to claim 11, wherein a contact surface of the color resist layer and the second passivation layer is provided with a gas passage, and the gas passage is in communication with a surface of the color resist layer on the second side.

15. The array substrate according to claim 11, wherein surfaces of the second passivation layer and the first passivation layer on the first side are both inclined surfaces.

16. The array substrate according to claim 11, wherein a cross section of an upper portion of the second side is in a right-angle shape, and a horizontal side of the right-angle shape is formed in the color resist layer by wet etching.

17. The array substrate according to claim 11, wherein the indium tin oxide (ITO) electrode layer is provided on a bottom surface of the passivation layer via hole and a side surface of the passivation layer via hole covered with the second passivation layer.

* * * * *